United States Patent
Akune

Patent Number: 5,831,565
Date of Patent: Nov. 3, 1998

[54] SIGNAL PROCESSING APPARATUS FOR CONVERTING MULTI-BIT SIGNAL HAVING SUB-DATA ADDED THERETO INTO ONE-BIT SIGNAL

[75] Inventor: Makoto Akune, Tokyo, Japan

[73] Assignee: Sony Corporation, Tokyo, Japan

[21] Appl. No.: 813,070

[22] Filed: Mar. 7, 1997

[30] Foreign Application Priority Data

Mar. 22, 1996 [JP] Japan .................................. 8-066834

[51] Int. Cl.$^6$ ........................... H03M 7/32; H03M 17/00
[52] U.S. Cl. ....................................... 341/143; 360/73.08
[58] Field of Search ............................. 341/143; 360/69, 360/73.08

[56] References Cited

U.S. PATENT DOCUMENTS

| | | | |
|---|---|---|---|
| 4,823,207 | 4/1989 | Kobayashi et al. | 360/32 |
| 4,829,497 | 5/1989 | Sako et al. | 369/50 |
| 4,918,677 | 4/1990 | Ashinuma et al. | 369/32 |
| 5,392,040 | 2/1995 | Hayashi | 341/143 |

Primary Examiner—Howard L. Williams
Assistant Examiner—Peguy JeanPierre
Attorney, Agent, or Firm—Jay H. Maioli

[57] ABSTRACT

A signal processing apparatus is arranged to convert a multi-bit audio signal having the conventional sampling frequency fs KHz and m quantizing bits (m is an integer) into a one-bit audio signal having the sampling frequency 64×fs KHz and one quantizing bit. Hence, the apparatus can offer an audio signal in a highly dynamic range. Further, the signal processing apparatus is arranged to separate sub-data added to the multi-bit audio signal in transmission from the multi-bit audio signal, sigma-delta modulate the multi-bit audio signal through the effect of a sigma-delta modulator. This suppresses the adverse effect on the audio signal. The apparatus is also arranged to control the supply of a timing signal and a clock signal to the sigma-delta modulator and a D/A converter based on the sub-data. This makes it possible to positively control a switching timing.

5 Claims, 6 Drawing Sheets

SIGNAL PROCESSING APPARATUS FOR CONVERTING MULTI-BIT SIGNAL HAVING SUB-DATA ADDED THERETO INTO ONE-BIT SIGNAL

BACKGROUND OF THE INVENTION

1. Field of the Invention

The present invention relates to a signal processing apparatus which operates to convert a first signal having a first sampling frequency and quantizing multi-bits into a second signal having a second sampling frequency being an integral multiple of the first sampling frequency and one quantizing bit.

2. Description of the Related Art

A method for converting an audio signal into a digital signal and recording, reproducing, and transmitting the digital signal has hitherto been implemented by a recording and reproducing apparatus with an optical disk such as a compact disk or a magnetic tape such as a digital audio tape (DAT) or a digital broadcasting system used in a broadcasting satellite. In this sort of digital audio transmitting apparatus, the sampling frequencies used for digitizing the audio signal are regulated as 48 KHz, 44.1 KHz, 32 KHz, and so forth and the quantizing bit numbers used therefor are regulated as 16 bits, 20 bits, and so forth.

As another method for digitizing an audio signal, a sigma-delta ($\Sigma\Delta$) modulating method has been known in YAMAZAKI, yoshio, "AD/DA Converter and Digital Filter", Japanese Acoustic Literary Society Proceedings, V. 46, I. 3 251–257 (1990).

As a first feature, the one-bit digital data obtained by the sigma-delta modulation is characterized to be formatted to have a far higher sampling frequency and a shorter data word length (in which, for example, the sampling frequency is a 64-times value of 44.1 KHz and the data word length is one bit) than a conventional data format of the digital audio signal (in which with a CD as an example, the sampling frequency is 44.1 KHz and the data word length is 16 bits) and to secure a broad transmittable frequency band. As a second feature, the one-bit digital data may offer a high dynamic range for an audio band which is far lower than the very high sampling frequency, that is, a 64-times value of the sampling frequency of the conventional data format. These features may be actively applied to a hi-fi recorder and data transmission.

Conventionally, a rate converter for converting a digital signal having the sampling frequency of 48 KHz and the quantizing bits of 16 bits into another digital signal having the sampling frequency of 44.1 KHz and the 16 quantizing bits has been disclosed in U.S. Pat. No. 4,748,578. However, for example, in a case of providing two kinds of optical disks, one optical disk on which is recorded multi-bit digital data having the sampling frequency of 44.1 KHz and the word length of 16 bits and the other optical disk on which is recorded one-bit data having the sampling frequency of 64×44.1 KHz (=2.8224 MHZ), the corresponding reproducing apparatuses to these compact disks are required to reproduce the audio signals recorded on the compact disks. This results in imposing a high cost on a user because he or she has to purchase two different apparatuses and forcing the user to suffer from inconvenience because he or she has to handle two apparatuses differently for the two kinds of compact disks. Therefore, the development of a reproducing apparatus that can compatibly reproduce data from these kinds of compact disks has been expected.

Further, the rate converter disclosed in the foregoing U.S. Pat. No. 4,748,578 is incapable of converting the multi-bit audio signal having the sampling frequency of 44.1 KHz and the 16 quantizing bits into a one-bit audio signal having the sampling frequency of 66×44.1 KHz and one quantizing bit.

SUMMARY OF THE INVENTION

The present invention is made in consideration of the foregoing shortcomings, and it is an object of the present invention to provide a signal processing apparatus which is arranged to convert multi-bit digital data having a sampling frequency fs into one-bit digital data having a sampling frequency m×fs.

It is a further object of the present invention to provide a signal processing apparatus which is arranged to suppress the quantizing distortion caused by re-quantization to a minimum for making the conversion high-efficient.

According to an aspect of the present invention, a signal processing apparatus for converting a multi-bit digital signal having sub-data added thereto in transmission in which signal the sampling frequency is fs and the quantizing bit is m bits (m: integral) into a one-bit digital signal in which the sampling frequency is n×fs (n: integral) and the quantizing bit is one bit, includes a discriminator for separating the sub-data from the multi-bit digital signal composed to be sampled at the sampling frequency fs and to have m quantizing bits; a converter for converting the multi-bit digital signal separated by the discriminator into the one-bit digital signal having the sampling frequency of n×fs and one quantizing bit; and a controller for controlling the converter based on the sub-data separated by the discriminator.

Further objects and advantages of the present invention will be apparent from the following description of the preferred embodiments of the invention as illustrated in the accompanying drawings.

DESCRIPTION OF THE PREFERRED EMBODIMENTS

Hereinafter, the description will be oriented to a signal processing apparatus according to some embodiments of the present invention with reference to the accompanying drawings.

Figure 1:
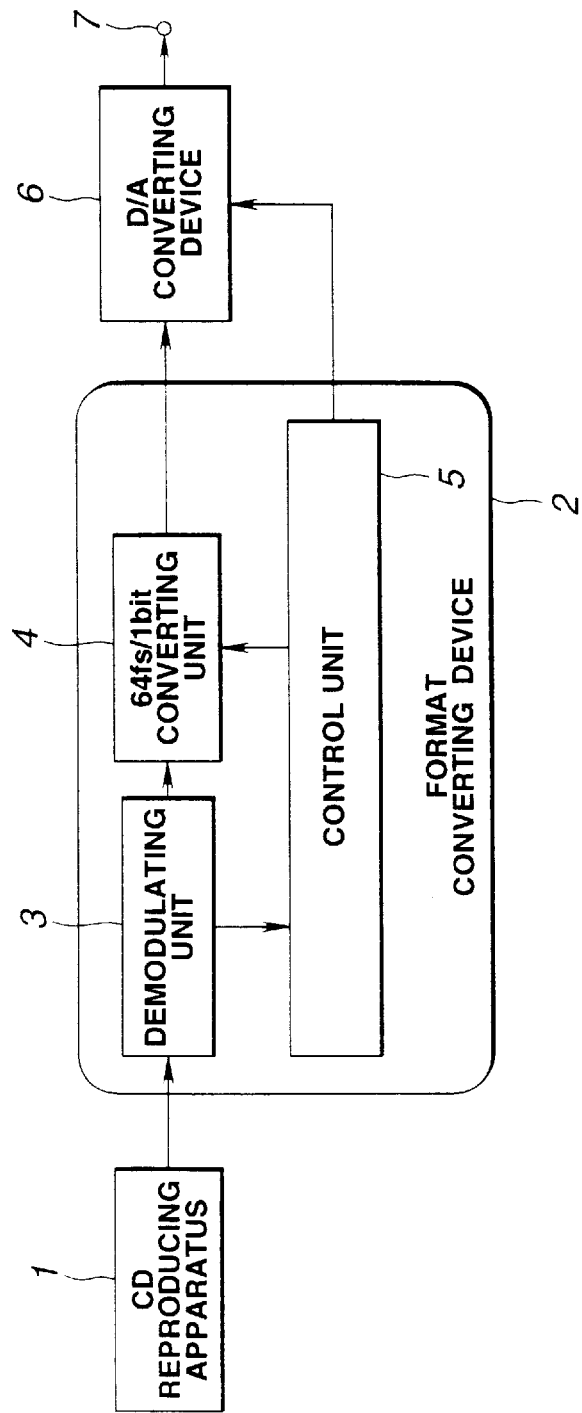
FIG. 1 is a block diagram showing a signal processing apparatus according to a first embodiment of the present invention.

As a first embodiment of the invention, FIG. 1 shows an audio reproducing apparatus. In this apparatus, a digital audio interface signal with a sampling frequency fs reproduced by a compact disk reproducing device 1 is converted into one-bit digital data with a sampling frequency of 64 fs through the effect of a format converting apparatus 2. The converted one-bit digital data is converted into an analog audio signal through the effect of a D/A converter 6.

The CD reproducing device 1 operates to reproduce multi-bit digital data having the sampling frequency fs of 44.1 KHz and the word length of 16 bits and additional data from the compact disk on which is recorded the multi-bit digital data modulated with the additional data through the effect of a light pickup unit. Then, the CD reproducing device 1 outputs the reproduced signal as a digital audio interface signal indicated in FIGS. 2A and 2B at a digital out terminal.

Figure 2:
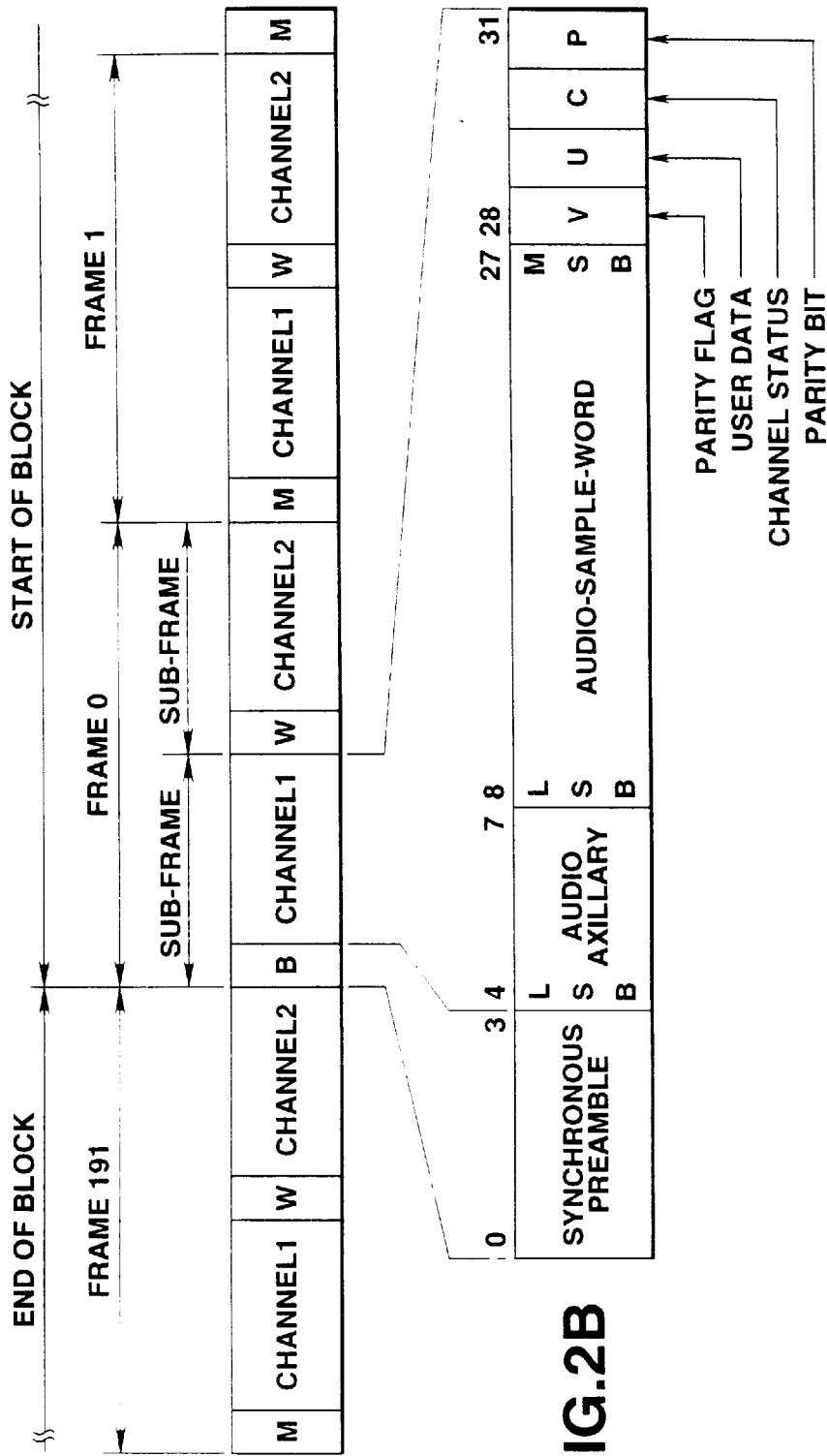
FIG. 2A is a view showing a format used in transmitting a multi-bit digital signal.
FIG. 2B is a view showing a format of a sub-frame used in transmitting the multi-bit digital signal.

In turn, the description will be oriented to this digital audio interface signal with reference to FIGS. 2A and 2B. The digital audio interface signal is composed of blocks, each block being composed of 192 serial frames, each frame being composed of two sub-frames, and each sub-frame having 32 time slots, the sub-frame being used for transmitting a signal. In the two-channel stereo transmission, the frame is composed of two sub-frames.

At the time slots 0 to 3 of the sub-frame, a synchronous preamble is transmitted. The synchronous preamble is used for extracting a period of the sub-frame, the frame, and the block. For example, the preamble of the sub-frame of the channel 1 in the frame 0 is set as B since this frame 0 is located at the head of the block. The preamble of the sub-frame of the channel 1 is normally set as "M". The preamble of the sub-frame of the channel 2 is constantly set as "W".

The time slots 4 to 7 are used for transmitting audio auxiliary information or an audio sample word used for converting the bit number of the audio sample word into 24 bits. The time slots 8 to 27 are used for transmitting an audio sample word.

The time slot 28 is used for transmitting a parity flag V. The time slot 29 is used for transmitting user data U. The time slot 30 is used for transmitting a channel status C. The time slot 31 is used for transmitting a parity bit P.

The parity flag V indicates if the audio sample word to be transmitted is correct or false. The user data U is used in response to the users request. The channel status C is a flag indicating which type of information the audio sample word is. As the audio sample data, there is considered information for a studio in a broadcasting station, a digital audio instrument for domestic use, or music software production. In this example, a flag used for the domestic-use digital audio instrument is transmitted. The parity bit P is an error-correcting code.

Then, the time slots 4 to 31 of the sub-frame are modulated by a by-phase marking system, for example.

This kind of digital audio interface signal is supplied to a format converting unit 2. This format converting unit 2 is arranged to have a demodulating unit 3 for demodulating the digital audio interface signal and separating the signal into the multi-bit digital data and the additional data, a data converting unit (denoted as 64 fs /1 bit in FIG. 1B) 4 for converting the multi-bit digital data separated by the demodulating unit 3 into one-bit digital data having the sampling frequency of 66×44.1 KHz (=2.8224 MHZ), and a control unit 5 for controlling the data converting unit 4 based on the additional data separated from the digital audio interface signal by the demodulating unit 3.

The additional data termed herein includes the parity flag V, the user data U, the channel status C, and the parity bit P as described above.

The demodulating unit 3 operates to demodulate the digital audio interface signal from the CD reproducing device 1 sent from the CD reproducing device 1, separate the digital audio interface signal into the multi-bit audio data and the additional data composed of the parity flag V, the user data U, the channel status C, and the parity bit P, and supply the audio data to the data converting unit 4 and the additional data to the control unit 5. That is, the demodulating unit 3 operates to demodulate and separate the data train composed of the audio data and the additional data at each sub-frame that is a frame with a fixed length.

Figure 3:
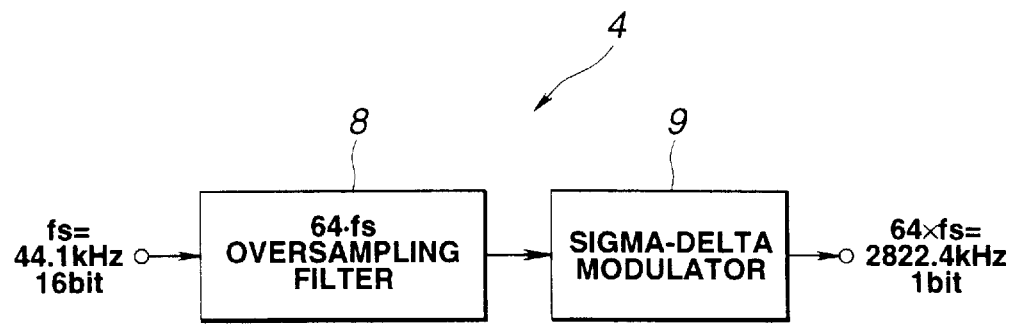
FIG. 3 is a block diagram showing a detail of a converting unit for converting the multi-bit digital signal into a one-bit digital signal.

As shown in FIG. 3, the data converting unit 4 is arranged to have an oversampling filter 8 for oversampling the sampling frequency of 44.1 KHz of the audio data into a 64-times value and a sigma-delta modulator 9. The sampling frequency of the audio data with the sampling frequency of 44.1 KHz and the 16 quantizing bits is oversampled to a 64-times value at one brush and then is sigma-delta modulated into the digital data with the sampling frequency of 2.8224 MHZ and one quantizing bit. The digital data is supplied to the D/A converter 6. This operation causes just one occurrence of quantizing distortion resulting from re-quantization, thereby suppressing the quantizing error to a minimum in conversion as well as suppressing the degradation of the sound quality of the digital data with the sampling frequency of 2.8224 MHZ and one quantizing bit to a minimum. The data converting unit 4 operates to convert the multi-bit audio data into one-bit digital data at each sub-frame.

Figure 4:
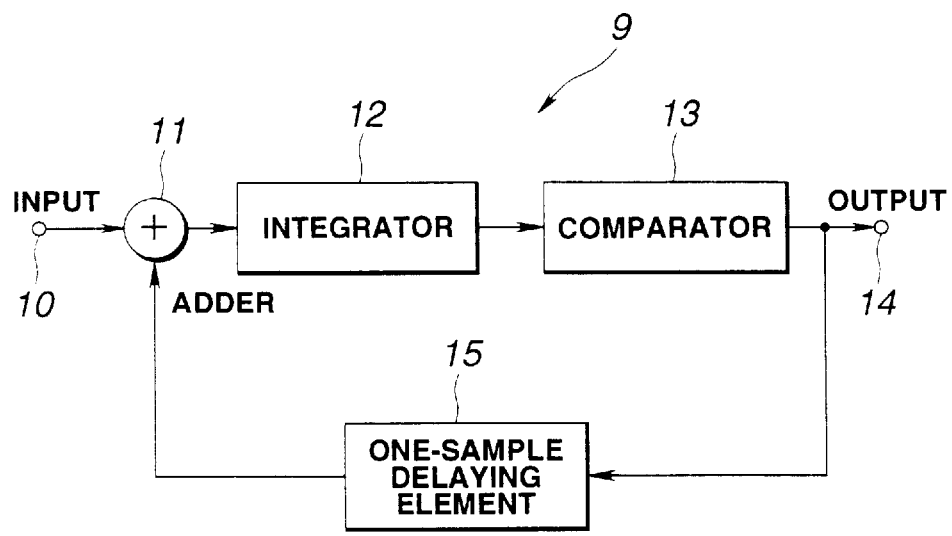
FIG. 4 is a block diagram showing a detail of a sigma-delta modulator.

The sigma-delta modulator 9 provided in the data converting unit 4 is arranged as shown in FIG. 4. The multi-bit digital data is supplied from an input terminal 10 to an integrator 12 through an adder 11. The signal from the integrator 12 is supplied to a comparator 13 for quantizing the signal one bit by one bit at each sampling period. The quantized data is supplied to one sample delaying element 15 in which the data is delayed by one sampling period. The delayed data is supplied to the adder 11 in which the delayed data is added to the multi-bit digital data supplied at the input terminal 10. The quantized data output from the comparator 13 is picked up as the sigma-delta modulated one-bit digital data at an output terminal 14.

In FIG. 1, the control unit 5 operates to control the data converting unit 4 and the D/A converting device 6 based on the additional data supplied from the demodulating unit 3. A timing signal is supplied to the data converting unit 4. On the timing signal, the sigma-delta modulator 9 performs a sigma-delta modulation with respect to the multi-bit digital signal separated by the demodulating unit 3. A clock is supplied to the D/A converting device 6 for D/A converting the signal.

The D/A converting device 6 operates to convert the digital data of 2.8224 MHZ and one bit supplied from a format converting device 2 into an analog audio signal and feed it at an output terminal 7.

As set forth above, the audio reproducing apparatus according to the first embodiment of the present invention is executed to oversample the sampling frequency of the audio data with the sampling frequency of 44.1 KHz and the 16 quantizing bits to a 64-times frequency at a brush, perform a sigma-delta modulation with respect to the enhanced frequency, and supply to the D/A converting device 6 as the digital data having the sampling frequency of 2.8224 MHZ and one quantizing bit. Hence, the audio reproducing apparatus needs just one occurrence of a quantizing distortion caused by re-quantization, thereby suppressing the quantizing error to a minimum and being able to reproduce the hi-fi digital data having the sampling frequency of 2.8224 MHZ and one quantizing bit.

Further, in the case of using this audio reproducing apparatus as a compatible reproducing apparatus, that is, producing a reproducing apparatus for reproducing both types of optical disks, that is, the conventional multi-bit compact disk and the new compact disk on which is recorded the digital data having a new sampling frequency of 2.8224 MHZ and one quantizing bit, the D/A converting unit may be commonly used for both of the compact disks, which leads to reducing the apparatus in size and lowering the cost of the apparatus.

Figure 5:
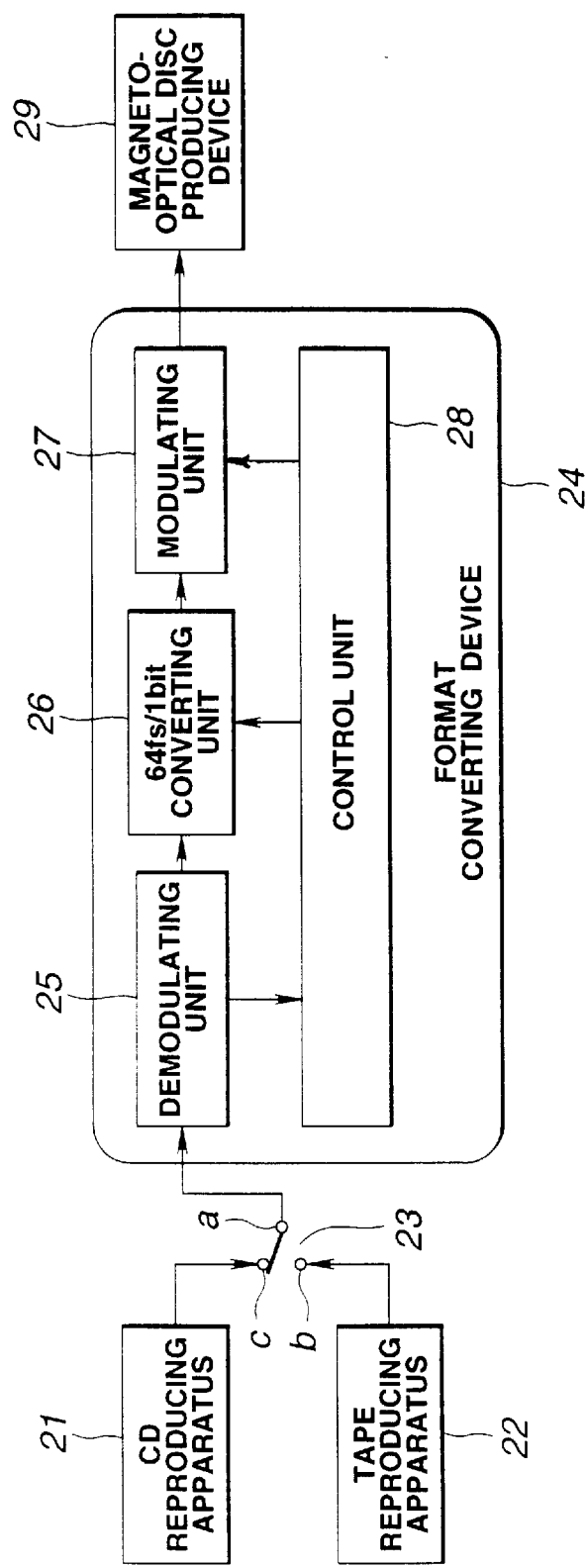
FIG. 5 is a block diagram showing a signal processing apparatus according to a second embodiment of the present invention.

In turn, the description will be oriented to a mastering apparatus according to a second embodiment of the present invention as shown in FIG. 5. As shown, a CD reproducing device 21 or a tape reproducing device 22 operates to reproduce a digital audio interface signal having a sampling frequency fs and supply the signal to a format converting device 24. The format converting device 24 operates to convert the above signal into the digital data having the sampling frequency of 64×fs and one quantizing bit and add the additional data and then modulate the signal. The modulated signal is supplied to a magneto-optical disk producing device 29 in which the modulated signal is recorded on a master magneto-optical disk.

The digital audio interface signal output by the CD reproducing device 21 in the format shown in FIGS. 2A and 2B are supplied to a terminal c of a switch 23. The digital audio interface signal produced by the tape reproducing device 22 is supplied to a terminal b of the switch 23. According to the switched side of a movable piece a, the digital audio interface signal from the CD reproducing device 21 or the tape reproducing device 22 is supplied to the format converting device 24.

The format converting device 24 is arranged to have a demodulating unit 25 for demodulating any one of the digital audio interface signals and separating the signal into the multi-bit digital data and the additional data, a data converting unit (denoted as 64 fs/1 bit in FIG. 5) for converting the multi-bit digital data separated by the demodulating unit 25 into the one-bit digital data having a sampling frequency of 64×44.1 KHz (=2.8224 MHZ) and one quantizing bit, a modulating unit 27 for adding the additional data, the synchronous preamble, and the audio axillary to the one-bit data having the sampling frequency of 2.8224 MHZ and one quantizing bit sent from the data converting unit 26, and a control unit 28 for controlling the data converting unit 26 and the modulating unit 27 based on the additional data.

The demodulating unit 25 operates to demodulate and separate any one of the digital audio interface signals according to the switched operation of the switch 23. Then, the multi-bit audio data is supplied to the data converting unit 26, while the additional data composed of the parity flag V, the user data U, the channel status C, and the parity bit P is supplied to the control unit 28.

The data converting unit 26 has the arrangement shown in FIG. 3. In operation, the sampling frequency of the audio data is oversampled from 44.1 KHz to a 64-times value. The audio data is sigma-delta modulated into a digital data having the sampling frequency of 2.8224 MHz and one quantizing bit and then supplied to the modulating unit 27.

Hence, this operation needs just one occurrence of a quantizing distortion caused by the re-quantization, thereby suppressing the quantizing error to a minimum and the sound quality degradation to a minimum.

The control unit 28 operates to control the data converting unit 26 and the modulating unit 27 based on the additional data supplied from the demodulating unit 25. The data converting unit 26 receives a timing signal for the sigma-delta modulation to be done by the sigma-delta modulator 9. A timing control signal is sent to the modulating unit 27. On the timing control signal, the sigma-delta modulated signal is supplied from the data converting unit 26 to the magneto-optical disk producing device 29. At a time, the additional data, the synchronous preamble, and the audio auxiliary are also sent to the modulating unit 27.

The modulating unit 27 operates to add the additional data, the synchronous preamble and the audio axillary to the sigma-delta modulated signal from the data converting unit 26 and perform the modulation such as EFM (Eight-Fourteen Modulation) or ECC (Error-Correcting Coding). The resulting signal is recorded on the magneto-optical disk through the magneto-optical disk producing device 29.

Then, the magneto-optical disk producing device 29 is served to record on the magneto-optical disk the modulated data composed of the additional data and the sigma-delta modulated signal having the sampling frequency of 2.8224 MHZ and one quantizing bit.

As set forth above, the mastering apparatus according to the second embodiment of the invention is operated to oversample the sampling frequency of 44.1 KHz of the audio data into a 64-times value at a brush, perform a sigma-delta modulation with respect to the audio data having the sampling frequency of 2.8224 MHZ and one quantizing bit for converting the audio data into digital data, add the additional data to the digital data for generating the modulated data, and record the modulated data on the magneto-optical disk through the effect of the magneto-optical disk producing device 29. This operation, therefore, makes it possible to suppress the quantizing error and the sound quality degradation of the resulting digital signal to a minimum.

Figure 6:
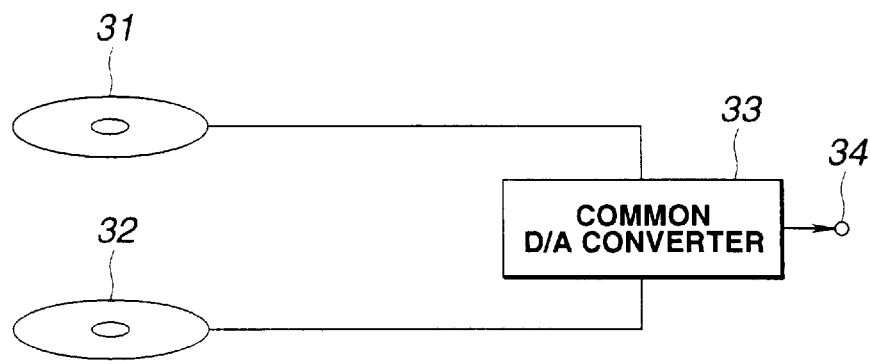
FIG. 6 is a model view showing a system for reproducing an analog audio signal from a mastering disk produced by a mastering apparatus illustrated in the second embodiment and another mastering disk produced in the format of a one-bit digital signal through a common D/A converter.

Further, each of one-bit digital data, which are recorded on an optical disk 31 for reproduction as shown in FIG. 6 produced on the master magneto-optical disk obtained by converting the CD data and on a newly produced optical disk for reproduction containing the data having the sampling frequency of 2.8224 MHZ and one quantizing bit, is converted into an analog audio signal through a common D/A converter 33 and then is guided out at an output terminal 34. The data recorded on the optical disk for reproduction produced from the compact disk by the mastering apparatus can be converted into an analog audio signal through the effect of the D/A converter 33 for the new optical disk 32 for reproduction.

Figure 7:
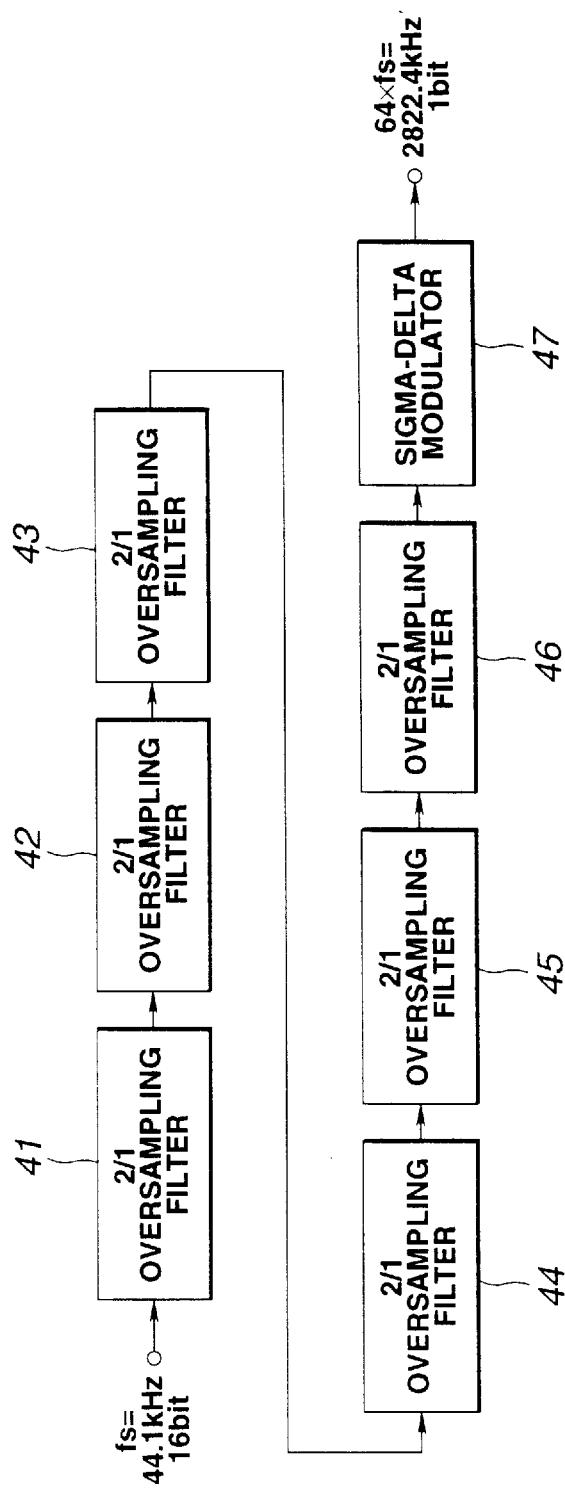
FIG. 7 is a block diagram showing an arrangement of a multi-stage over-sampling filter in the frequency of 64×fs (KHz) used in the present application.

According to the first and the second embodiments of the invention, the data converting units 4 and 26 may be arranged as shown in FIG. 7. That is, the sampling frequency of the multi-bit digital data with the sampling frequency 44.1 KHz and the 16 quantizing bits is oversampled to a 64-times value through six double oversampling filters 41, 42, 43, 44, 45 and 46 connected in series. Then, the digital data with the resulting frequency may be sigma-delta modulated into the data with the sampling frequency of 2822.4 KHz and one quantizing bit by the signal-delta modulator 47.

The method as shown in FIG. 7 has a shortcoming that the one-bit data may contain round errors, because the quantizing distortion is brought about by the re-quantization caused by the double oversampling filters 41, 42, 43, 44, 45 and 46.

When generating one-bit digital data with the sampling frequency m·fs (m is an integer) from a data stream produced by modulating the multi-bit digital data with the sampling frequency fs and the additional data, the signal processing apparatus according to the present invention is arranged to modulate the data stream for separating it into the multi-bit digital data and the additional data through the demodulating means, converting the multi-bit digital data into the one-bit digital data having the sampling frequency m·fs through the effect of the data converting means, and control the data converting means based on the additional data through the effect of the control means. Hence, the signal processing apparatus can be used to convert the multi-bit digital data having the sampling frequency fs into the one-bit digital data having the sampling frequency m·fs.

In addition, the data converting means may operate to enhance the sampling frequency fs to a m-times frequency at a brush before performing the sigma-delta modulation with respect to the multi-bit digital data. This operation makes it possible to suppress the quantizing distortion caused by re-quantization to a minimum, for making the conversion more high-efficient.

As set forth above, the signal processing apparatus according to the first embodiment of the invention is arranged to separate the data signal composed of the sub-data and the multi-bit audio signal having the conventional sampling frequency fs KHz and the m quantizing bits (m is an integer) into the multi-bit audio signal and the sub-data and perform the sigma-delta modulation with respect to the separated signal through the effect of the sigma-delta modulator. Hence, the signal processing apparatus does not have an adverse effect on the audio signal. Further, the signal processing apparatus is arranged to control the supply of the timing signal and the clock signal to the sigma-delta modulator and the D/A converter based on the sub-data. Hence, the signal processing apparatus can be used to positively control the switching timing. Moreover, the mastering apparatus according to the second embodiment of the invention is arranged to separate the data signal composed of the sub-data and the multi-bit audio signal having the conventional sampling frequency fs KHz and the m quantizing bits (m is an integer) into the multi-bit audio signal and the sub-data and perform the sigma-delta modulation with respect to the multi-bit audio signal through the effect of the sigma-delta modulator, modulate the sub-data, and then add the sub-data to a one-bit signal modulated by the sigma-delta modulator. Hence, the mastering apparatus can be used to supply a digital one-bit signal in the same format of the digital multi-bit signal indicated in the prior art of FIGS. 2A and 2B.

Many widely different embodiments of the present invention may be constructed without departing from the spirit and scope of the present invention. It should be understood that the present invention is not limited to the specific embodiments described in the specification, except as defined in the appended claims.

What is claimed is:

1. A signal processing apparatus for converting a digital signal composed of a multi-bit digital signal and sub-data added thereto in transmission, said multi-bit digital signal having a sampling frequency fs and m quantizing bits (m is an integer), into a one-bit digital signal having an n-times sampling frequency n×fs (n is an integer) and one quantizing bit, comprising:

separating means for separating said digital signal into said sub-data and said multi-bit digital signal having said sampling frequency fs and said m quantizing bits;

converting means for converting said multi-bit digital signal separated by said separating means into a one-bit digital signal having said sampling frequency n×fs and one quantizing bit; and control means for controlling said converting means based on said sub-data separated by said separating means.

2. The signal processing apparatus as claimed in claim 1, wherein said converting means comprises an oversampling filter for oversampling said multi-bit digital signal at said sampling frequency n×fs and a sigma-delta modulator for converting an output signal from said oversampling filter into said one-bit digital signal having one quantizing bit.

3. The signal processing apparatus as claimed in claim 1, further comprising a D/A converter and wherein said control means controls said D/A converter based on said sub-data separated by said separating means.

4. The signal processing apparatus as claimed in claim 1, wherein said separating means separates said digital signal to said multi-bit digital signal and said sub-data at each given frames unit and said converting means converts said multi-bit digital signal into said one-bit digital signal at said given frames unit.

5. The signal processing apparatus as claimed in claim 1, further comprising second modulating means for modulating said sub-data separated by said separating means.

\* \* \* \* \*